United States Patent
Bradley

(10) Patent No.: US 9,239,371 B1
(45) Date of Patent: Jan. 19, 2016

(54) HIGH POWER INPUT PROTECTION FOR SIGNAL MEASUREMENT DEVICES

(71) Applicant: Anritsu Company, Morgan Hill, CA (US)

(72) Inventor: Donald Anthony Bradley, Morgan Hill, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 241 days.

(21) Appl. No.: 14/064,967

(22) Filed: Oct. 28, 2013

(51) Int. Cl.
*G01S 7/03* (2006.01)
*G01S 7/02* (2006.01)

(52) U.S. Cl.
CPC ........................... *G01S 7/023* (2013.01)

(58) Field of Classification Search
CPC .............................................. G01S 7/023
USPC .................................................. 342/175, 198
See application file for complete search history.

(56) References Cited

U.S. PATENT DOCUMENTS

| | | | | |
|---|---|---|---|---|
| 3,670,328 A | * | 6/1972 | Mardon | G01S 13/583 327/570 |
| 3,740,640 A | * | 6/1973 | Ravas | G01S 7/282 307/108 |
| 5,291,208 A | * | 3/1994 | Young | H02H 3/22 342/198 |
| 5,446,463 A | * | 8/1995 | Beaucourt | H03G 11/04 327/73 |
| 5,473,332 A | * | 12/1995 | James | G01S 7/023 342/101 |
| 6,785,110 B2 | * | 8/2004 | Bartel | H01Q 1/50 361/111 |
| 2003/0072121 A1 | * | 4/2003 | Bartel | H01Q 1/50 361/119 |
| 2014/0292562 A1 | * | 10/2014 | Subramanian | G01S 7/032 342/175 |

* cited by examiner

*Primary Examiner* — John B Sotomayor
(74) *Attorney, Agent, or Firm* — Tucker Ellis LLP

(57) ABSTRACT

A protection device usable with a signal measurement device to limit power level of radio frequency (RF) signals propagated to the signal measurement device can include a direct current (DC) block capacitor, a variable impedance limiter, and a detector. The variable impedance limiter includes a PIN diode electrically connected with a primary signal path of the protection device along a limiter signal path. The detector includes a Schottky detector diode and a limiting resistor electrically connected with the primary signal path along a detector signal path. The detector is configured to generate a DC bias current to adjust resistance of the variable impedance limiter in response to an RF signal.

18 Claims, 7 Drawing Sheets

HIGH POWER INPUT PROTECTION FOR SIGNAL MEASUREMENT DEVICES

TECHNICAL FIELD

The present invention relates generally to devices for limiting high power signal propagation and more specifically to devices for protecting signal measurement devices from high power signals.

BACKGROUND

In electronics, a limiter circuit is a circuit that allows radio frequency (RF) signals below a specified input power to pass while attenuating the peaks of stronger signals that exceed the specified input power. Limiter circuits are commonly used, for example, in radio detection and ranging (radar) systems, to protect receivers from high power transmitters that use the same antennas.

FIGS. 1A and 1B illustrate a pair of limiter circuits A, B associated with commercially available devices that use PIN diodes. If the power of a signal at an input 14 is within range, the signal propagates to the output 16 of the limiter circuit A, B unattenuated, with PIN diodes 2, 4 exhibiting a small capacitance. As the power of the signal increases and the PIN diodes 2, 4 detect a threshold voltage present in the forward direction, the PIN diodes 2, 4 begin to conduct. In the limiter circuit of FIG. 1A, the positive polarity component of an RF signal received at the input 14 is shunted to ground when a single PIN diode 2 detects a voltage exceeding a threshold. A return path is provided for the PIN diode 2 via an inductor 6 connected to ground. In the limiter circuit of FIG. 1B, the positive polarity component of an RF signal received at the input 14 is shunted to ground when a first PIN diode 2 detects a voltage exceeding a threshold and the negative polarity component of the RF signal received at the input 14 is shunted to ground when a second PIN diode 4 substituted for the return path detects a voltage exceeding a threshold.

FIG. 1C is an example plot approximating power curves for limiter circuits such as shown in FIGS. 1A and 1B. As reflected in the power curves, the limiter circuits begin limiting at relatively low powers. Further, the power curves are frequency dependent. A PIN diode stores a relatively large charge in an intrinsic region of the PIN diode. The charge is removable at low frequencies to allow the PIN diode to turn off. The PIN diode, therefore, obeys the standard diode equation for low frequency signals. At higher frequencies, there is not enough time to store the charge and the PIN diode does not turn ON, allowing high power, high frequency signals to pass through the limiter circuit unattenuated.

The power response characteristics of limiter circuits as shown in FIG. 1A-1C make such limiter circuits generally undesirable for use with high precision signal measurement devices, particularly signal measurement devices intended for use measuring very high frequency signals, and/or which can be exposed to high power, very high frequency signals from an input source.

SUMMARY

In accordance with an embodiment, a protection device usable with a signal measurement device to limit radio frequency (RF) signals propagated to the signal measurement device based on power level of the RF signals can comprise a direct current (DC) block capacitor, a variable impedance limiter, and a detector. The variable impedance limiter includes a PIN diode electrically connected with a primary signal path of the protection device along a limiter signal path. The detector includes a Schottky detector diode and a limiting resistor electrically connected with the primary signal path along a detector signal path. The detector is configured to generate a direct current (DC) bias current to adjust resistance of the variable impedance limiter in response to an RF signal.

In an embodiment, the primary signal path is configured to propagate an RF signal to and from the signal measurement device, the DC block capacitor is a first DC block capacitor, and the protection device further comprises a second DC block capacitor arranged along the primary signal path so that the variable impedance limiter and the detector are arranged between the first DC block capacitor and the second DC block capacitor. In such embodiments, the protection device can comprise a first port adapted to be connected to a device under test (DUT) and a second port adapted to be connected to the signal measurement device.

In an embodiment, the protection device can be a stand alone module with a primary signal path adapted to be connected between ground and a signal path extending from a DUT to the signal measurement device. In such an embodiment, the protection device can further comprise a first port adapted to be connected with the signal path and a second port adapted to be connected to ground. The limiter signal path and the detector signal path can be connected in parallel along the primary signal path.

In some embodiments, the detector of the protection device further includes a Zener diode. The Schottky detector diode can be arranged so as to be forward biased by a negative polarity component of the RF signal and the Zener diode can be arranged so as to subtract from this forward bias, thus raising the needed RF signal level to forward bias the Schottky detector diode. An activation voltage of the Schottky detector diode can correspond to a breakdown voltage of the Zener diode.

In some embodiments, the protection device can further comprise a shunt for reflecting a high power level signal. The shunt can include, for example, a heat sink and a bimetal configured to electrically short the primary signal path to the heat sink upon heating to a sufficient temperature.

In an embodiment, an instrument for measuring scattering parameters of a DUT comprises a port, a RF signal generator, a primary signal path connected with the port and configured to propagate an RF signal to and from the signal measurement device, and a protection circuit. The protection circuit limits RF signals propagated to the signal measurement device based on power level of the RF signals and includes a DC block capacitor, a variable impedance limiter and a detector. The variable impedance limiter includes a PIN diode electrically connected with the primary signal path along a limiter signal path and the detector includes a Schottky detector diode and a limiting resistor electrically connected with the primary signal path along a detector signal path. The detector is configured to generate a DC bias current to adjust resistance of the variable impedance limiter in response to an RF signal.

In an embodiment, the DC block capacitor is a first DC block capacitor and the protection circuit of the instrument further includes a second DC block capacitor arranged along the primary signal path such that the variable impedance limiter and the detector are arranged between the first DC block capacitor and the second DC block capacitor.

In some embodiments, the detector of the protection circuit further includes a Zener diode. The Schottky detector diode can be arranged so as to be forward biased by a negative polarity component of the RF signal and the Zener diode can be arranged so as to subtract from this forward bias, thus raising the needed RF signal level to forward bias the Schottky detector diode. An activation voltage of the Schottky detector diode can correspond to a breakdown voltage of the Zener diode.

BRIEF DESCRIPTION OF THE DRAWINGS

Further details of the present invention are explained with the help of the attached drawings in which:

FIG. 8A illustrates an alternative embodiment of an instrument in accordance with the present invention for measuring scattering parameters of a DUT, allowing DC to pass through.

DETAILED DESCRIPTION

Figure 1A:
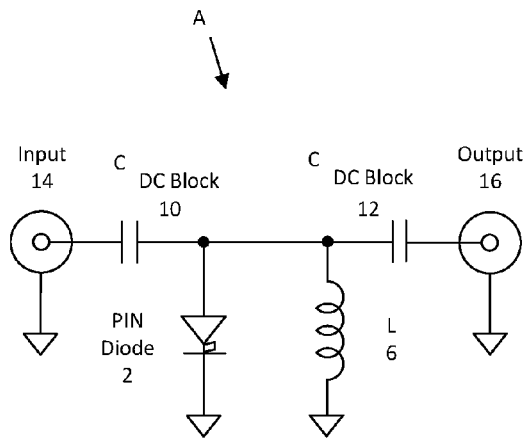
FIG. 1A illustrates a limiter circuit in accordance with the prior art.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. In addition, the first digit of a reference number for an embodiment of the invention identifies the drawing in which the reference number first appears.

It would be apparent to one of skill in the art that the present invention, as described below, may be implemented in many different embodiments of hardware, software, firmware, and/or the entities illustrated in the figures. Further, the frequencies given for signals generated and/or used in the figures and description are merely exemplary. Any actual software, firmware and/or hardware described herein, as well as any frequencies of signals generated thereby, is not limiting of the present invention. Thus, the operation and behavior of the present invention will be described with the understanding that modifications and variations of the embodiments are possible, given the level of detail presented herein.

Signal measurement devices, such as vector network analyzers (VNAs) and scalar network analyzers (SNAs), are commonly used for measuring parameters indicative of performance of a device under test (DUT). A technician can measure the performance of an antenna in a cellular network, for example, by disconnecting the antenna from a transmitter associated with the antenna and connecting the antenna to the signal measurement device. The signal measurement device can transmit test signals and receive reflected signals in response. However, signal measurement devices commonly operate at powers below 100 milliwatt (mW) (i.e., below 20 dBm), much lower than typical transmit powers of DUTs.

An antenna for a high power transmitter can be remotely connected to the transmitter via multiple cables. For example, a cable leading to an antenna and a cable leading from a high power transmitter may be connected together in a jumper room. A technician testing the antenna will typically do so in the jumper room by disconnecting the appropriate cable and reconnecting the cable to a signal measurement device. This presents an opportunity for a low power signal measurement device to be accidentally connected with a cable leading to a high power transmitter rather than to the antenna. A signal transmitted at the high powers associated with a transmitter for a cellular site can damage the circuitry of a signal measurement device, which is designed to operate at powers many magnitudes lower. A limiting circuit that can redirect most of the power of a signal transmitted from a high power transmitter can limit risk of such events. High power transmitters themselves are capable of handling reflected, high power signals using isolators that can redirect the reflected power into a load.

Figure 1B:
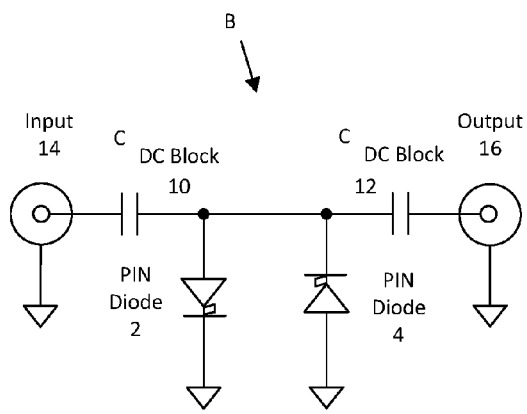
FIG. 1B illustrates another limiter circuit in accordance with the prior art.
Figure 1C:
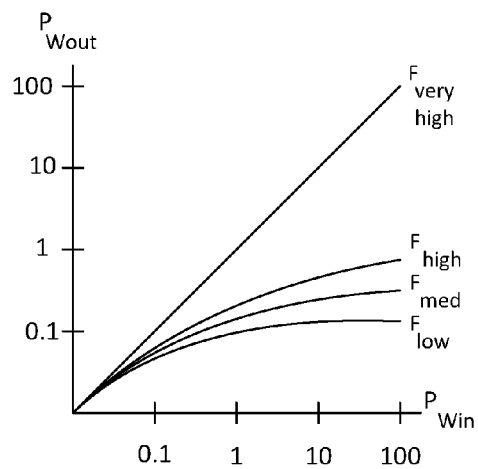
FIG. 1C is an example plot approximating power curves for the limiter circuits of FIGS. 1A and 1B.

Prior art limiter circuits suffer from limiting at very low powers and failure to limit at very high frequencies. As previously described above in reference to FIGS. 1A-1C, once the power level of an input signal increases sufficiently, a PIN diode detects a threshold voltage present in the forward direction and begins to conduct, shunting the signal to ground and reflecting most of the power of the signal back to the signal source. However, high power transmitters, for example in cellular networks, can operate at very high frequencies. At higher frequencies, there is not enough time to store charge in the intrinsic region of the PIN diode and the PIN diode becomes more and more resistive.

Figure 2A:
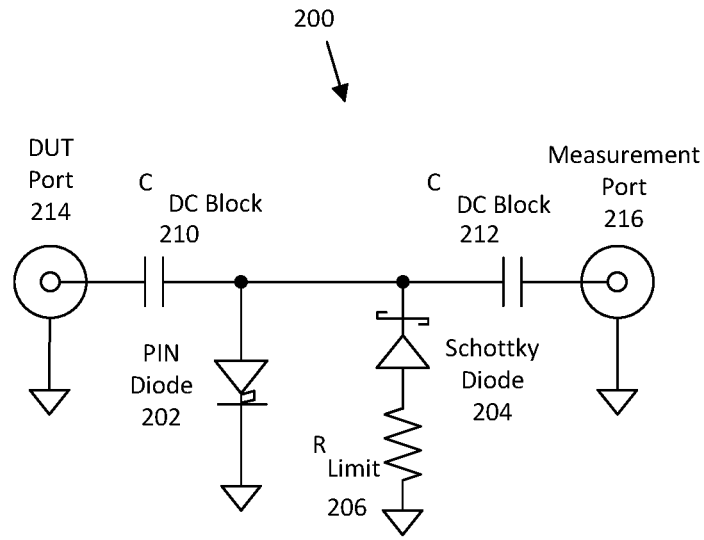
FIG. 2A illustrates an embodiment of a protection device in accordance with the present invention usable with a signal measurement device to limit power levels of radio frequency (RF) signals propagated to the signal measurement device.

FIG. 2A illustrates an embodiment of a protection device 200 in accordance with the present invention usable with a signal measurement device to limit a power level of RF signals propagated to the signal measurement device. As shown, the protection device 200 comprises a primary signal path extending between a port 214 connectable with a DUT (not shown) and a port 216 connectable with the signal measurement device (not shown). The protection device 200 allows test signals transmitted by the signal measurement device to be propagated to a DUT along the primary signal path and reflected signals received in response to test signals and transmit signals received from other signal measurement devices to be propagated to the signal measurement device along the primary signal path.

The protection device 200 further comprises a variable impedance limiter and a detector. The variable impedance limiter and the detector are gated along the primary signal path by a pair of DC block capacitors 210, 212 that prevent the propagation of DC signals along the primary signal path with limited interference to RF signals. The variable impedance limiter includes a PIN diode 202 connected with the primary signal path via a limiter signal path to ground. If the protection device 200 is connected with a low frequency, high power transmitter at the DUT port 214, the Schottky diode 204 begins conducting upon detecting a voltage above a threshold and produces an average current to the PIN diode 202 which causes the input signal to be shunted to ground. Most of the power of the input signal is reflected to the source of the input signal.

The high-frequency resistance of the PIN diode 202 is inversely proportional to a DC bias current through the PIN diode 202. Therefore, the PIN diode 202, suitably biased, acts as a variable resistor. The detector is connected with the primary signal path via a detector signal path to ground and includes a Schottky detector diode 204. A Schottky detector diode has no storage charge and can detect RF signals at high frequencies but is a small physical diode having very low capacitance. The detector further includes a limiting resistor 206 to prevent the Schottky detector diode from shunting all negative polarity components of an input signal independent of signal power and overheating. The Schottky detector diode develops a DC bias current limited by the limiting resistor 206. The Schottky detector diode 204 senses the high frequency, high power signal and adjusts the DC bias current to lower the resistance of the PIN diode 202. The PIN diode 202 continues to shunt the high frequency signal to ground and reflects most of the power back to the source.

Figure 2B:
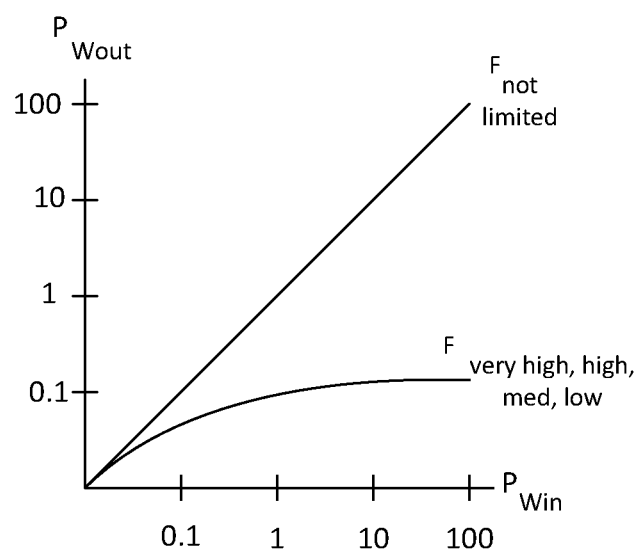
FIG. 2B is an example plot approximating power curves for the protection device of FIG. 2A.

The inventor has observed that the protection device 200 of FIG. 2A eliminates variation in limiting performance associated with increases in frequency, making the protection device 200 frequency independent. The protection device 200 further limits high power signals even at very high frequencies, unlike available limiting circuits. FIG. 2B is an example plot approximating the power curves associated with the protection device 200 of FIG. 2A. As shown, the protection device 200 begins limiting the signal at low power, but does not vary with frequency, even at very high frequencies.

Figure 3A:
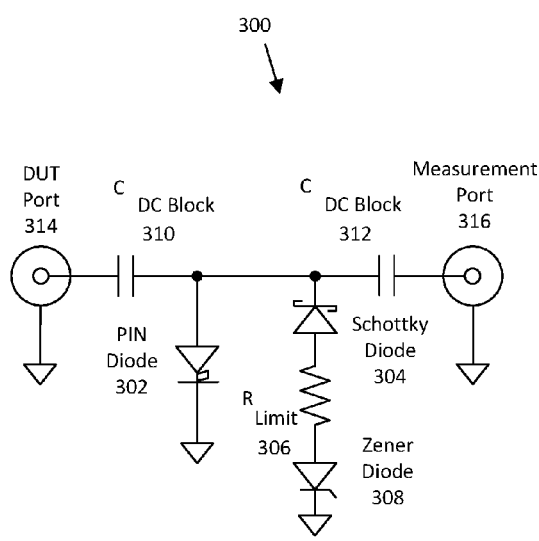
FIG. 3A illustrates an alternative embodiment of a protection device in accordance with the present invention usable with a signal measurement device to limit power levels of RF signals propagated to the signal measurement device.

FIG. 3A illustrates an alternative embodiment of a protection device 300 in accordance with the present invention usable with a signal measurement device to limit a power level of RF signals propagated to the signal measurement device. As shown, the protection device 300 comprises a primary signal path extending between a port 314 connectable with a DUT and a port 316 connectable with the signal measurement device (not shown). The protection device 300 allows test signals sent by the signal measurement device to be propagated to a DUT along the primary signal path and reflected signals and incident signals received in response to test signals to be propagated to the signal measurement device along the primary signal path.

The protection device 300 further comprises a variable impedance limiter and a detector. The variable impedance limiter and the detector are gated along the primary signal path by a pair of DC block capacitors 310, 312 that prevent the propagation of DC signals along the primary signal path with limited interference to RF signals. The variable impedance limiter is connected with the primary signal path via a limiter signal path to ground and includes a PIN diode 302.

The detector is connected with the primary signal path via a detector signal path to ground. The detector includes a Schottky detector diode 304 and a limiting resistor 306. The Schottky detector diode 304 is arranged so as to be forward biased by a negative polarity component of the RF signal. The detector further includes a Zener diode 308 arranged so as to subtract from this forward bias, thus raising the needed RF signal level to forward bias the Schottky detector diode. The Zener diode 308 prevents the Schottky detector diode 304 from detecting the voltage of the input signal until a voltage of the input signal reaches the breakdown voltage of the Zener diode 308. Once the breakdown voltage of the Zener diode 308 is exceeded, the Schottky detector diode 304 begins to detect, and continues to detect input signals beyond the power threshold at very high frequencies. The Schottky detector diode 304, once detecting, develops a DC bias current limited by the limiting resistor 306. The Schottky detector diode 304 senses the high frequency and adjusts the DC bias current to lower the resistance of the PIN diode 302. The PIN diode 302 shunts the high frequency signal to ground and reflect most of the power back to the source.

Figure 3B:
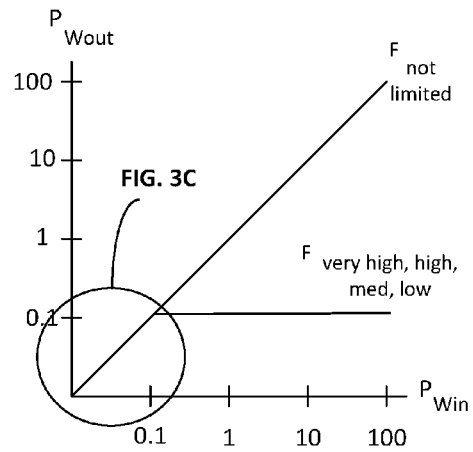
FIG. 3B is an example plot approximating power curves for the protection device of FIG. 3A.
Figure 3C:
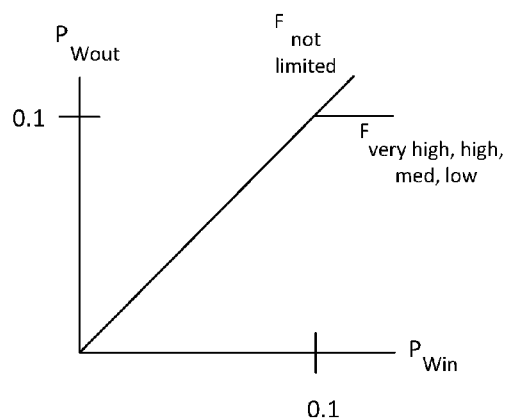
FIG. 3C is a scaled view of a portion of the power curves of FIG. 3B.

The inventor has observed that the protection device 300 of FIG. 3A passes signals in a frequency independent matter, and further does not begin limiting at low power, but rather begins limiting power at the breakdown voltage of the Zener diode 308, giving the protection device 300 a cleaner cutoff for limiting power. FIG. 3B is an example plot approximating the power curves associated with the protection device 300 of FIG. 3A and FIG. 3C is a zoomed in portion of the example plot approximating the power curves at low powers. As mentioned above, many signal measurement devices for measuring network parameters operate below 100 mW, and as shown in FIG. 3C, the protection device 300 can be constructed so as not to begin limiting the signal until the input power exceeds some operational threshold of the signal measurement device, for example 100 mW.

Figure 4:
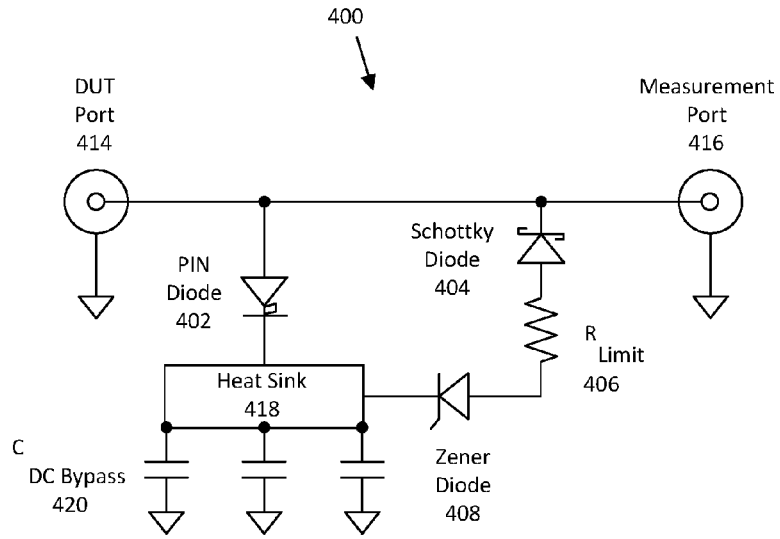
FIG. 4 illustrates an alternative embodiment of a protection device in accordance with the present invention usable with a signal measurement device to limit power levels of RF signals propagated to the signal measurement device and pass direct current (DC).

FIG. 4 illustrates an alternative embodiment of a protection device 400 in accordance with the present invention usable with a signal measurement device to limit a power level of RF signals propagated to the signal measurement device. As above, the protection device 400 comprises a primary signal path extending between a port 414 connectable with a DUT and a port 416 connectable with the signal measurement device (not shown). The protection device 400 allows test signals sent by the signal measurement device to be propagated to a DUT along the primary signal path and reflected signals and incident signals received in response to test signals to be propagated to the signal measurement device along the primary signal path.

The protection device 400 further comprises a variable impedance limiter and a detector. The variable impedance limiter is connected with the primary signal path via a limiter signal path to ground and includes a PIN diode 402. The detector is connected with the primary signal path via a detector signal path to ground and includes a Schottky detector diode 404, a Zener diode 408 and a limiting resistor 406. The Zener diode 408 is arranged so that a forward direction of the Zener diode 408 is opposite of a forward direction of the Schottky detector diode 404. The variable impedance limiter and the detector are both connected with a heat sink 418 and a series of DC bypass capacitors 420. At very high frequencies, the Schottky detector diode 404 develops a DC bias current limited by the limiting resistor 406. The Schottky detector diode 404 senses the high frequency and adjusts the DC bias current to lower the resistance of the PIN diode 402. The PIN diode 402 continues to shunt the high frequency signal to alternating current (AC) ground and reflect most of the power back to the source. The DC bypass capacitors 408 isolate DC signals from ground.

The inventor has observed that the protection device 400 of FIG. 4 has similar performance characteristics to the protection device 300 of FIG. 3A, passing signals in a frequency independent matter, and further does not begin limiting at low power, but rather begins limiting power at the breakdown voltage of the Zener diode 408.

Figure 5:
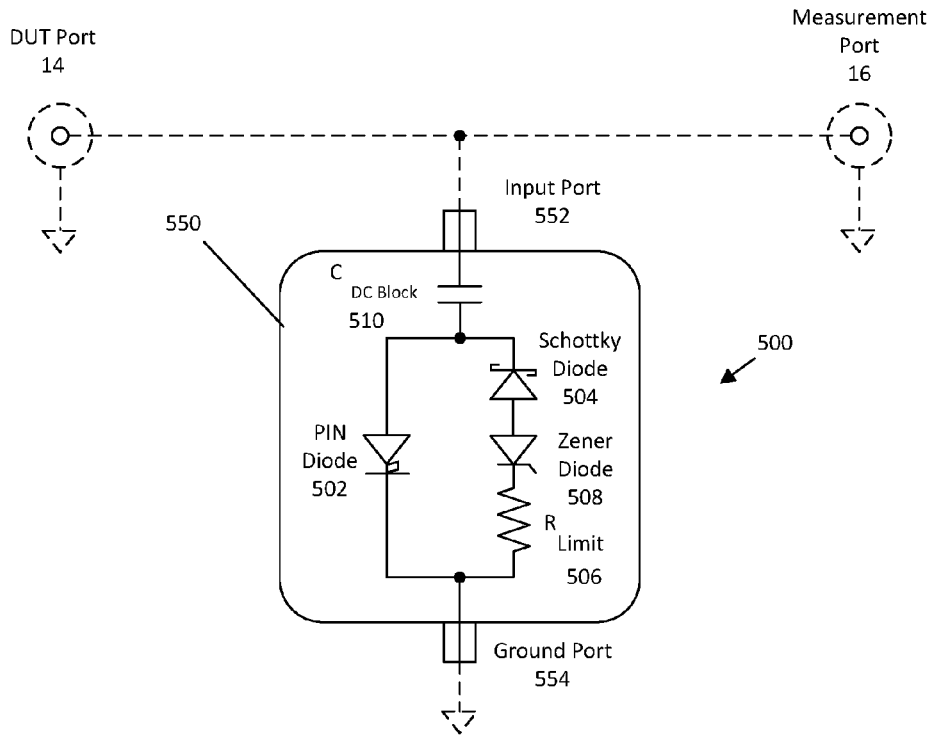
FIG. 5 illustrates an alternative embodiment of a protection device in accordance with the present invention connectable between a DC blocked signal measurement device and a DUT to limit power levels of RF signals propagated to the signal measurement device.

FIG. 5 illustrates an embodiment of a high power protection device 500 in accordance with the present invention with limiting circuitry contained within a housing 550 having an input port 552 and a ground port 554. A variable impedance limiter and a detector are arranged parallel to each other branching out from a primary signal path extending between the ports 552, 554. The high power protection device 500 is connectable to ground at the ground port 554 and is connectable at the input port 552 to a signal path extending between a DUT port 14 and the measurement port 16. (These components are shown in phantom because they are not components of the high power protection device 500). The high power protection device 500 further comprises a DC block capacitor 510 arranged between the variable impedance limiter and detector and the input port 552. The DC block capacitor 510 prevents the propagation of DC signals to the signal path extending between the DUT port and the measurement port 16 with limited interference to RF signals.

As above, the variable impedance limiter includes a PIN diode 502. The detector includes a limiting resistor 506 and a Schottky detector diode 504 arranged so as to be forward biased by a negative polarity component of an RF signal received at the input port 552. The detector further includes a Zener diode 508 arranged so as to subtract from this forward bias, thus raising the needed RF signal level to forward bias the Schottky detector diode. As above, the Schottky detector diode 504, once detecting, develops a DC bias current limited by the limiting resistor 506. The Schottky detector diode 504 senses the high frequency and adjusts the DC bias current to lower the resistance of the PIN diode 502. The PIN diode 502 shunts the high frequency signal to ground and reflects most of the power back to the source. The independently housed high power protection device 500 can be used with multiple different signal measurement devices. This allows, for example, a customer with multiple devices to economize the customer's operations or a customer with older equipment to benefit from the protection circuit.

Figure 6:
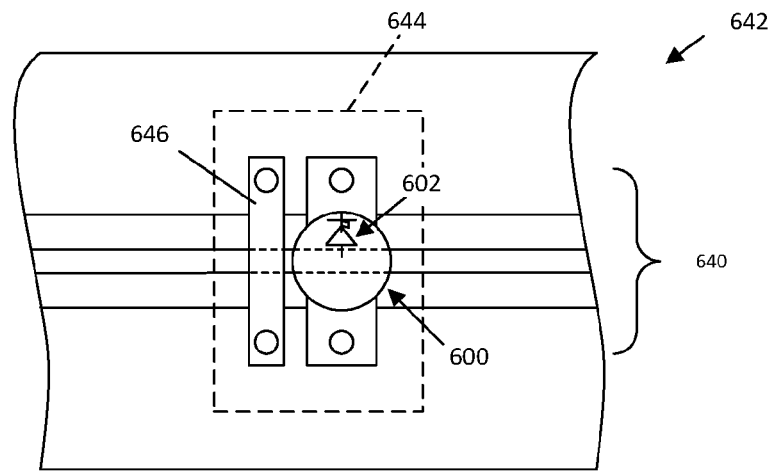
FIG. 6 illustrates an embodiment of a bimetal shunt in accordance with the present invention usable with protection devices to limit power levels of RF signals propagated to signal measurement devices.

Referring to FIG. 6, a shunt 642 is shown usable with embodiments of protection circuits and instruments in accordance with the present invention. A PIN diode 602 is resistive and can dissipate, for example, 10 W of a 100 W signal transmitted by the transmitter and shunted by the PIN diode 602, thereby generating heat. The PIN diode 602 is physically connected with a heat sink to dissipate generated heat. As discussed above, when a high power transmitter detects a reflected signal, the transmitter will stop transmitting. However, high power transmitters typically reset and continue to send signals to test whether a reflection is still present (a reflection may be transitory and therefore need not be addressed by a technician—consider a bird landing on an antenna). It can be desirable to protect the PIN diode 602 from overheating.

The shunt 642 comprises a separate heat sink 644 and a bimetal 646 arranged adjacent to the protection circuit 600 along a coplanar waveguide 640 (as shown). The protection circuit 600 can attenuate high power signals, but will rapidly increase in temperature and can fail after some period of time, for example on the order of minutes of continuous or frequent input. As the protection circuit 600 heats up, the bimetal 646 of the shunt 642 will heat up and bend toward the heat sink 644. When the bimetal 646 contacts the heat sink 644, the incoming signal will be shunted to the heat sink 644 and the entire signal will be reflected back to the transmitter, generating little heat due to the low resistance of the shunt 642. As the protection circuit 600 cools, the bimetal 646 will cool and bend away from the heat sink 644, allowing normal operation. If high power signals continue to be transmitted to the protection circuit, the shunt 642 can again heat up and short to the heat sink 644.

In other embodiments of the present invention, rather than comprising a separate physical protection circuit, the protection circuit can be a protection circuit integrated into a signal measurement device. Embodiments of signal measurement devices in accordance with the present invention can comprise any of the protection circuits described above. Examples of such embodiments are given in FIGS. 7-9.

Figure 7:
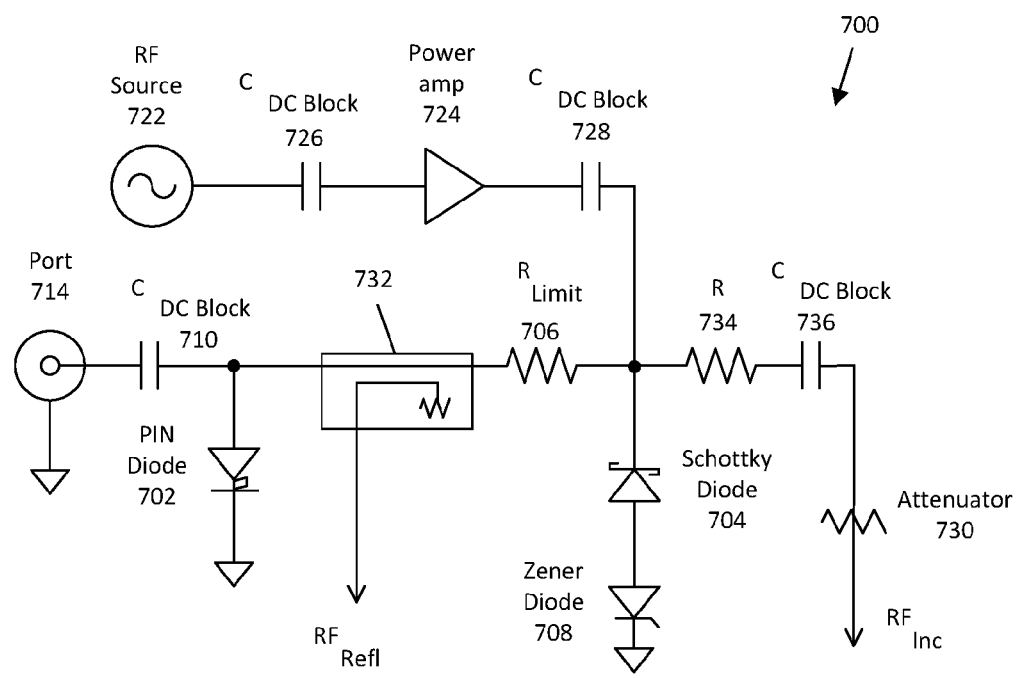
FIG. 7 illustrates an embodiment of an instrument in accordance with the present invention for measuring scattering parameters of a device under test (DUT).

Referring to FIG. 7, an embodiment of an instrument 700 adapted to measure scattering parameters of a DUT is shown. The instrument 700 comprises an RF source 722 and a power amplifier 724 gated by a pair of DC block capacitors 726, 728 for generating test signals that are transmitted to a DUT. Reflected signals that are reflected back to the instrument are coupled 732 to a receiver. An incident signal is obtained from the RF source 722 via a circuit path including a resistor 734, a DC block capacitor 736 and an attenuator 730. The incident signal can be used as a reference for measuring the phase of the reflected signal coupled to the receiver relative to a signal that is transmitted to the DUT.

The instrument 700 of FIG. 7 further comprises a protection circuit including a variable impedance limiter and a detector. As shown, the variable impedance limiter includes a PIN diode 702, a forward direction of the PIN diode 702 being connected to ground. The detector includes a limiting resistor 706 arranged between the RF source 722 and the port 714, a Schottky detector diode 704 arranged so as to be forward biased by a negative polarity component of an RF signal received at the port 714, and a Zener diode 708 arranged so as to subtract from this forward bias, thus raising the needed RF signal level to forward bias the Schottky detector diode 704. As above, the Schottky detector diode 704, once detecting, develops a DC bias current limited by the limiting resistor 706. The Schottky detector diode 704 senses the high frequency and adjusts the DC bias current to lower the resistance of the PIN diode 702. The PIN diode 702 shunts the high frequency signal to ground and reflects most of the power back to the source.

The protection circuit of the instrument 700 will exhibit limiting performance similar to that shown in FIG. 3C, allowing low power signals to pass substantially unaffected, while limiting high power signals. The Schottky detector diode 704 and Zener diode 702 combination is moved to a non-sensitive part of the circuit which ratios out during measurements, $$S_{11} = \frac{RF_{Refl}}{RF_{Inc}}.$$

Figure 8A:
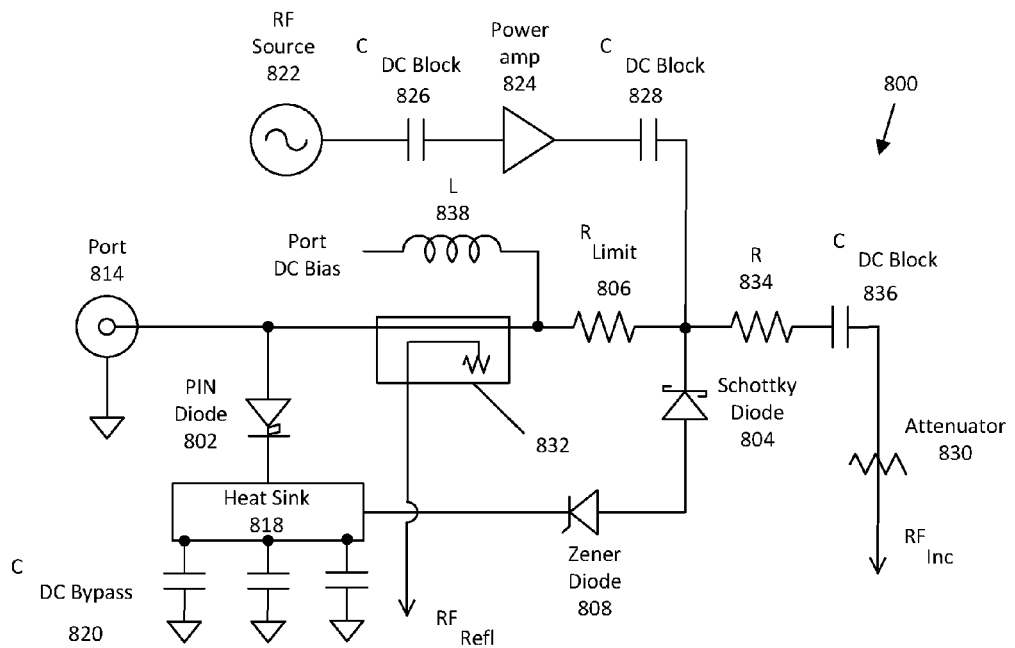
Figure 8B:
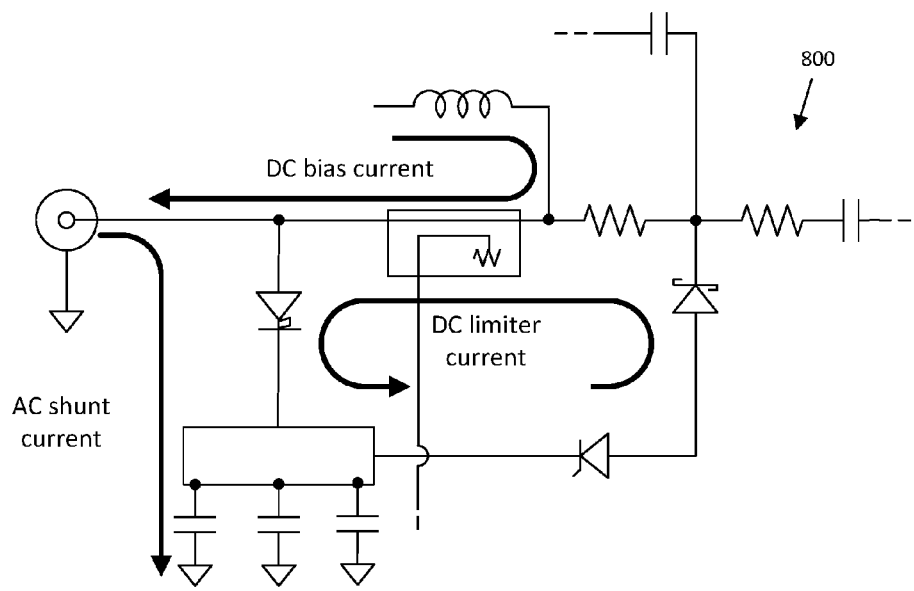
FIG. 8B shows the current paths for the protection circuit of the instrument of FIG. 8A.

Referring to FIGS. 8A and 8B, an alternative embodiment of an instrument 800 adapted to measure scattering parameters of a DUT is shown. As above, the instrument 800 comprises an RF source 822, a power amplifier 824 gated by a pair of DC block capacitors 826, 828, for generating test signals that are transmitted to a DUT. Reflected signals that are reflected back to the instrument are coupled to a receiver at a coupler 832. A DC signal is provided through a signal path including an inductor 838. An incident signal is obtained from the RF source 822 via a circuit path including a resistor 834, a DC block capacitor 836 and an attenuator 830. The incident signal can be used as a reference for measure the phase of the reflected signal coupled to the receiver, relative to a signal that is transmitted to the DUT.

The instrument 800 of FIG. 8A further comprises a protection circuit including a variable impedance limiter and a detector. As shown, the variable impedance limiter includes a PIN diode 802, a forward direction of the PIN diode 802 being connected to a heat sink 818, similar to the protection circuit 400 of FIG. 4. The detector includes a limiting resistor 806, a Schottky detector diode 804 connected to the heat sink 818 and arranged so as to be forward biased by a negative polarity component of an RF signal received at the port 814, and a Zener diode 808 arranged so as to subtract from this forward bias, thus raising the needed RF signal level to forward bias the Schottky detector diode 804. The heat sink 818 is connected to a series of DC bypass capacitors 820.

FIG. 8B shows the current path associated with the protection circuit of the instrument of FIG. 8A. As shown, with the DC limiter current biasing the PIN diode, AC current is shunted to ground. The DC bias current provided through the inductor 838 forms a bias T used for biasing amplifiers and other devices that need DC while being measured for scattering parameters. The protection circuit of the instrument 800 will exhibit limiting performance similar to that shown in FIG. 3C, allowing low power signals to pass substantially unaffected, while limiting high power signals.

Figure 9:
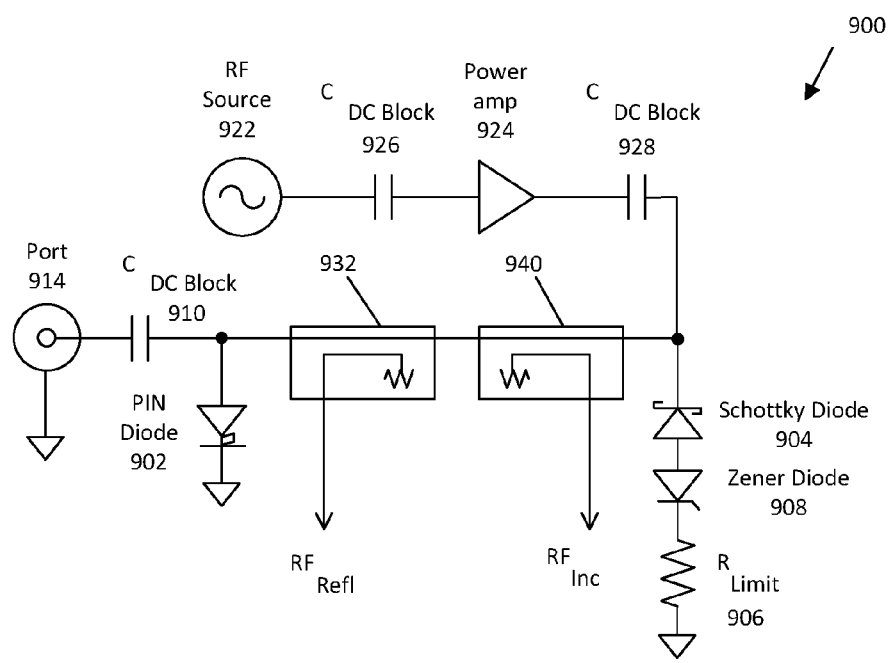
FIG. 9 illustrates a further embodiment of an instrument in accordance with the present invention for measuring scattering parameters of a DUT.

Referring to FIG. 9, an alternative embodiment of an instrument 900 adapted to measure scattering parameters of a DUT is shown. As above, the instrument 900 comprises an RF source 922, a power amplifier 924 gated by a pair of DC block capacitors 926, 928, for generating test signals that are transmitted to a DUT. Reflected signals that are reflected back to the instrument are coupled to a receiver at a first coupler 932. An incident signal is obtained from the RF source 922 via a second coupler 940. The incident signal can be used as a reference for measure the phase of the reflected signal coupled to the receiver, relative to a signal that is transmitted to the DUT.

The instrument 900 of FIG. 9 further comprises a protection circuit including a variable impedance limiter and a detector. As shown, the variable impedance limiter includes a PIN diode 902, a forward direction of the PIN diode 902 being connected to ground. The detector includes a limiting resistor 906 and a Schottky detector diode 904 arranged so as to be forward biased by a negative polarity component of an RF signal received at the port 914. The detector further includes a Zener diode 908 arranged so as to subtract from this forward bias, thus raising the needed RF signal level to forward bias the Schottky detector diode 904. As above, the Schottky detector diode 904, once detecting, develops a DC bias current limited by the limiting resistor 906. The Schottky detector diode 904 senses the high frequency and adjusts the DC bias current to lower the resistance of the PIN diode 902. The PIN diode 902 shunts the high frequency signal to ground and reflects most of the power back to the source. A DC blocking capacitor 910 prevents Schottky detector diode 904 voltage from exiting the port 914. The protection circuit of the instrument 900 will exhibit limiting performance similar to that shown in FIG. 3C, allowing low power signals to pass substantially unaffected, while limiting high power signals.

The present invention may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A protection device adapted to be used with a signal measurement device to limit radio frequency (RF) signals propagated to the signal measurement device based on power level of the RF signals, comprising:
   a primary signal path;
   a direct current (DC) block capacitor arranged along the primary signal;
   a variable impedance limiter including a PIN diode electrically connected with the primary signal path along a limiter signal path; and
   a detector including a Schottky detector diode and a limiting resistor electrically connected with the primary signal path along a detector signal path; and
   wherein the detector is configured to generate a DC bias current to adjust resistance of the variable impedance limiter in response to an RF signal.

2. The protection device of claim 1,
   wherein the primary signal path is configured to propagate an RF signal to and from the signal measurement device;
   wherein the DC block capacitor is a first DC block capacitor; and
   further comprising:
      a second DC block capacitor arranged along the primary signal path; and
      wherein the variable impedance limiter and the detector are arranged between the first DC block capacitor and the second DC block capacitor.

3. The protection device of claim 2, further comprising:
   a first port adapted to be connected to a device under test (DUT); and
   a second port adapted to be connected to the signal measurement device.

4. The protection device of claim 1, wherein the primary signal path is adapted to be connected between ground and a signal path extending from a device under test (DUT) to the signal measurement device; and
   further comprising:
      a first port adapted to be connected with the signal path; and
      a second port adapted to be connected to ground; and
      wherein the limiter signal path and the detector signal path are connecting in parallel along the primary signal path.

5. The protection device of claim 1, wherein
   the detector further comprises a Zener diode;
   the Schottky detector diode is configured to be forward biased by a negative polarity component of an RF signal and the Zener diode is configured to subtract from a forward bias of the Schottky detector diode to raise an activation voltage of the Schottky detector diode; and
   the activation voltage of the Schottky detector diode corresponds to a breakdown voltage of the Zener diode.

6. The protection device of claim 1, further comprising:
a shunt to reflect a high power level signal configured to operate based on heat dissipated by the protection device.

7. The protection device of claim 5, wherein the shunt includes
a heat sink; and
a bimetal configured to electrically short the primary signal path to the heat sink upon heating to a sufficient temperature.

8. An instrument adapted to measure scattering parameters of a device under test (DUT), comprising:
a port;
a radio frequency (RF) signal generator;
a primary signal path connected with the port and configured to propagate an RF signal to and from the signal measurement device;
a protection circuit to limit radio frequency (RF) signals propagated to the signal measurement device based on power level of the RF signals including
a direct current (DC) block capacitor arranged along the primary signal path, and
a variable impedance limiter including a PIN diode electrically connected with the primary signal path along a limiter signal path, and
a detector including a Schottky detector diode and a limiting resistor electrically connected with the primary signal path along a detector signal path, and
wherein the detector is configured to generate a DC bias current to adjust resistance of the variable impedance limiter in response to an RF signal.

9. The instrument of claim 8,
wherein the DC block capacitor is a first DC block capacitor; and
further comprising:
a second DC block capacitor arranged along the primary signal path; and
wherein the variable impedance limiter and the detector are arranged between the first DC block capacitor and the second DC block capacitor.

10. The instrument of claim 8, wherein
the detector of the protection circuit further comprises a Zener diode;
the Schottky detector diode is forward biased by a negative polarity component of the RF signal and the Zener diode subtracts from the forward bias of the Schottky detector diode to raise an activation voltage of the Schottky detector; and
the activation voltage of the Schottky detector diode corresponds to a breakdown voltage of the Zener diode.

11. The instrument of claim 8, further comprising:
a shunt for reflecting a high power level signal configured to operate based on heat dissipated by the protection circuit.

12. The instrument of claim 11, wherein the shunt includes
a heat sink, and
a bimetal configured to electrically short the primary signal path to the heat sink upon heating to a sufficient temperature.

13. The instrument of claim 8, further comprising:
a coupler for coupling a detector to reflected signals propagated to the instrument from a DUT in response to a test signal.

14. A protection device usable with a signal measurement device to limit radio frequency (RF) signals propagated to the signal measurement device based on power level of the RF signals, comprising:
a primary signal path;
a direct current (DC) block capacitor arranged along the primary signal;
a variable impedance limiter including a PIN diode electrically connected with the primary signal path along a limiter signal path; and
a detector including a Schottky detector diode, a limiting resistor, and a Zener diode electrically connected with the primary signal path along a detector signal path;
wherein the detector is configured to generate a direct current (DC) bias current to adjust resistance of the variable impedance limiter in response to an RF signal.

15. The protection device of claim 14, wherein
the Schottky detector diode is forward biased by a negative polarity component of the RF signal and the Zener diode is arranged to subtract from the forward bias of the Schottky detector diode to raise an activation voltage of the Schottky detector diode to forward bias the Schottky detector diode; and
the activation voltage of the Schottky detector diode corresponds to a breakdown voltage of the Zener diode.

16. The protection device of claim 14, further comprising:
a first port adapted to be connected to a signal path extending between a device under test (DUT) and the signal measurement device; and
a second port adapted to be connected to ground;
wherein the primary signal path is connected between the first port and the second port; and
wherein the limiter signal path and the detector signal path are connecting in parallel along the primary signal path.

17. The protection device of claim 14, further comprising:
a shunt for reflecting a high power level signal configured to operate based on an amount of heat dissipated by the protection device.

18. The protection device of claim 17, wherein the shunt includes
a heat sink, and
a bimetal configured to electrically short the primary signal path to the heat sink upon heating to a sufficient temperature.

* * * * *